United States Patent
Wang et al.

(10) Patent No.: US 8,124,954 B2
(45) Date of Patent: Feb. 28, 2012

(54) CONDUCTIVE BRIDGING RANDOM ACCESS MEMORY DEVICE AND METHOD OF MANUFACTURING THE SAME

(75) Inventors: Ching-Chiun Wang, Miaoli County (TW); Cha-Hsin Lin, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 278 days.

(21) Appl. No.: 12/472,386

(22) Filed: May 27, 2009

(65) Prior Publication Data
US 2010/0163829 A1    Jul. 1, 2010

(30) Foreign Application Priority Data
Dec. 30, 2008 (TW) .............................. 97151426 A

(51) Int. Cl.
*H01L 29/04* (2006.01)
(52) U.S. Cl. .......... 257/3; 257/4; 257/E27.098; 711/104
(58) Field of Classification Search .................. None
See application file for complete search history.

(56) References Cited

U.S. PATENT DOCUMENTS
2003/0173558 A1   9/2003  Campbell
2008/0232160 A1*  9/2008  Gopalakrishnan ............ 365/163
2009/0004538 A1   1/2009  Heggemann et al.

FOREIGN PATENT DOCUMENTS
JP    2007-509509    4/2007

OTHER PUBLICATIONS

IDS Reference Michael N. Kozicki et al., "A Low-Power Nonvolatile Switching Element Based on Copper-Tungsten Oxide Solid Electrolyte," IEEE Transactions on Nanotechnology, vol. 5, No. 5, Sep. 2006, pp. 535-544.*
Michael N. Kozicki et al., "A Low-Power Nonvolatile Switching Element Based on Copper-Tungsten Oxide Solid Electrolyte," IEEE Transactions on Nanotechnology, vol. 5, No. 5, Sep. 2006, pp. 535-544.
Xin Guo et al., "Understanding the switching-off mechanism in Ag+ migration based resistively switching model systems," American Institute of Physics, Applied Physics Letters 91. 133513, 2007.
"First Office Action of China Counterpart Application", issued on May 13, 2011, p. 1-p. 5, in which the listed reference was cited.

* cited by examiner

*Primary Examiner* — Evan Pert
*Assistant Examiner* — Scott R Wilson
(74) *Attorney, Agent, or Firm* — Jianq Chyun IP Office

(57) ABSTRACT

A conductive bridging random access memory (CBRAM) device and a method of manufacturing the same are provided. The CBRAM device includes a first electrode layer, a dielectric layer, a solid electrolyte layer, a second electrode layer and a metal layer. The solid electrolyte layer is located on the first electrode layer. The second electrode layer is located on the solid electrolyte layer. The metal layer is located near the solid electrolyte layer. The dielectric layer is located between the solid electrolyte layer and the metal layer. Since the metal layer is disposed near the solid electrolyte layer in the CBRAM device, it can generate a positive electric field during an erase operation, so as to accelerate a break of mutually connected metal filaments.

15 Claims, 5 Drawing Sheets

CONDUCTIVE BRIDGING RANDOM ACCESS MEMORY DEVICE AND METHOD OF MANUFACTURING THE SAME

CROSS-REFERENCE TO RELATED APPLICATION

This application claims the priority benefit of Taiwan application serial no. 97151426, filed on Dec. 30, 2008. The entirety of the above-mentioned patent application is hereby incorporated by reference herein and made a part of specification.

BACKGROUND OF THE INVENTION

1. Field of the Invention

The present invention relates to a conductive bridging random access memory (CBRAM) device and a method of manufacturing the same.

2. Description of Related Art

A CBRAM applies a non-volatile memory technique by which data accessing is performed according to a resistance variation. The CBRAM is belonged to a resistive random access memory (RRAM). A device structure of the CBRAM can be regarded as an electrolyzer composed of a metal anode (Ag or Cu), an inert cathode (Ni, W or Pt) and a solid electrolyte filled there between. A material of the solid electrolyte is glass-state chalcogenide or glass oxide. After a tiny voltage is applied between the anode and the cathode, an oxidation reaction is occurred at the anode, so that the metal on the surface of the anode releases electrons, and is dissolved into the electrolyte in an ion state. Due to an electrical migration, the metal ions are migrated towards the cathode. Finally, a reduction reaction is occurred on the surface of the cathode to precipitate conductive metal atoms and further form filaments, so as to decrease a whole resistance of the electrolyte to complete a write operation. Conversely, during an erase operation, the voltage is inversely applied to the electrodes, so that the filaments formed by the conductive metal atoms in the electrolyte are removed, and the resistance is gradually increased back to an initial state.

Regarding an oxide variable resistor having a bi-stable resistance switching, a low resistance path thereof (the filament) is a key to determine the resistance switching, and the metal filament is the low resistance path in the CBRAM. After an endurance test of the high-low resistance state conversion is performed to the device for tens of thousands of times, cycling times of the device and a switching time of the high-low resistance state conversion are probably reduced due to a quantity and distribution range of the filaments in the solid electrolyte.

SUMMARY OF THE INVENTION

The present invention provides a CBRAM device including a first electrode layer, a dielectric layer, a solid electrolyte layer, a second electrode layer and a metal layer. The solid electrolyte layer is located on the first electrode layer. The second electrode layer is located on the solid electrolyte layer. The metal layer is located near the solid electrolyte layer. The dielectric layer is located between the solid electrolyte layer and the metal layer.

The present invention provides a method for manufacturing a CBRAM device. The method includes following steps. First, a dielectric layer is formed on a first electrode layer, and then a series of processes including exposure, development and etching is performed to form at least a first groove in the dielectric layer. Next, a metal layer is filled in the first groove, and then another series of processes including exposure, development and etching is performed to form a second groove in the dielectric layer near the first groove, and the second groove exposes a part of a surface of the first electrode layer. Next, a solid electrolyte layer is deposited in the second groove, and finally a second electrode layer is deposited on the solid electrolyte layer.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
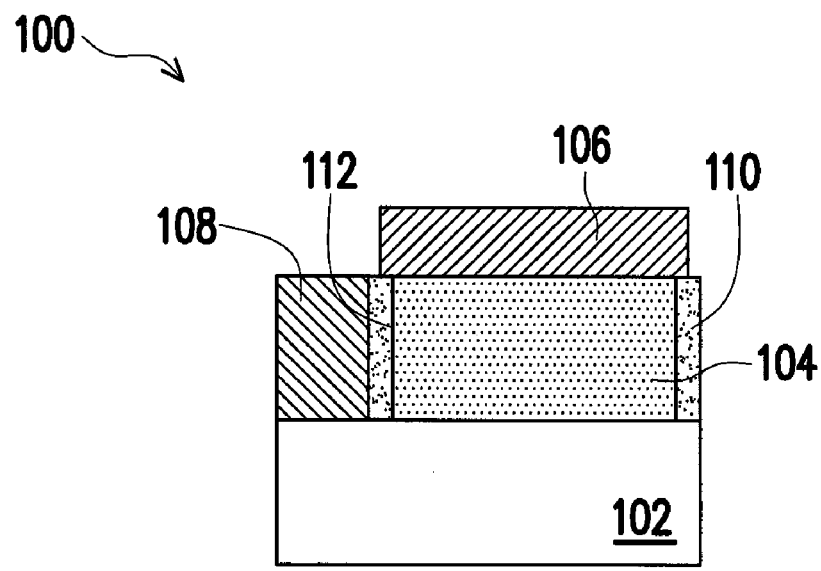
FIG. 1 is a cross-sectional view of a CBRAM device according to an embodiment of the present invention.

FIG. 1 is a cross-sectional view of a CBRAM device according to an embodiment of the present invention.

Referring to FIG. 1, the CBRAM device 100 of the present embodiment includes a first electrode layer 102, a dielectric layer 110, a solid electrolyte layer 104, a second electrode layer 106 and a metal layer 108, wherein a material of the first electrode layer 102 is, for example, an inert metal such as platinum (Pt), tungsten (W), titanium nitride (TiN) or nickel (Ni). The solid electrolyte layer 104 is located on the first electrode layer 102, and a material of the solid electrolyte layer 104 includes chalcogenide such as germanium selenium compound (Ge—Se) or germanium sulphur compound (Ge—S), or $Ag_2S$, $Cu_2S$, $Ta_2O_5$, $W_2O_3$ or $SiO_2$. The second electrode layer 106 is disposed on the solid electrolyte layer 104, and a material of the second electrode layer 106 includes Ag or Cu. The metal layer 108 can be a single-side structure located aside the sold electrolyte layer 104, and a material of the metal layer 108 can be a conductive metal composite material or a metal material. Moreover, in FIG. 1, the metal layer 108 and the first electrode layer 102 are electrically connected. The dielectric layer 110 is disposed between the solid electrolyte layer 104 and the metal layer 108, and a material of the dielectric layer 110 is, for example, $SiO_2$, SiN or polymethyl methacrylate (PMMA).

In FIG. 1, the dielectric layer 110 may have a groove 112, and the solid electrolyte layer 104 is located in the groove 112.

During an erase operation of the CBRAM device 100 of FIG. 1, since a positive voltage is applied to the first electrode layer 102, the metal layer 108 connected to the first electrode layer 102 may generate a positive electric field which can repels metal ions dispersed in the solid electrolyte layer 104, so that mutually connected metal filaments therein are easy to be broken, and an efficiency for the device being switched from a low to a high resistance state is increased, by which an endurance of the device can be improved, and a switching time can be reduced. Moreover, the metal layer 108 can also be coupled to an external circuit, so as to generate the positive electric field during the erase operation of the CBRAM device 100.

Figure 2:
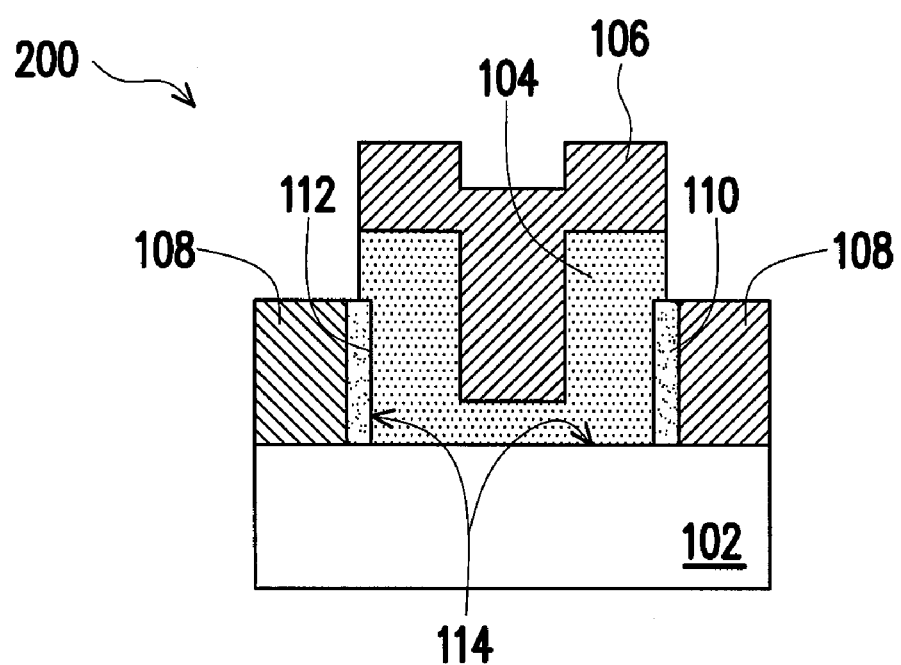
FIG. 2 is a cross-sectional view of another CBRAM device according to an embodiment of the present invention.

FIG. 2 is a cross-sectional view of another CBRAM device according to an embodiment of the present invention, wherein elements in FIG. 2 that are the same or similar to the elements of FIG. 1 are represented by the same or similar reference numerals.

Referring to FIG. 2, a difference between the CBRAM device 200 and the CBRAM device 100 of FIG. 1 is that the metal layer 108 is a double-side structure, and the solid electrolyte layer 104 covers an inner surface 114 of the groove 112 according to a contour of the groove 112. The second electrode layer 106 can be partially disposed in the groove 112 according to a shape of the solid electrolyte layer 104.

Figure 3:
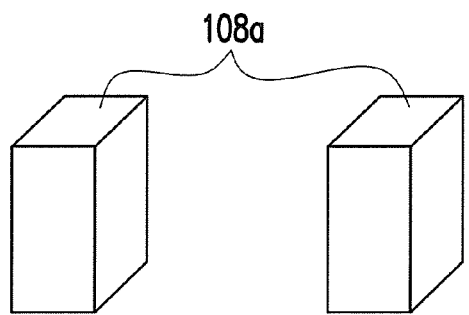
FIG. 3 is a top view of an embodiment of a metal layer of FIG. 2.
Figure 4:
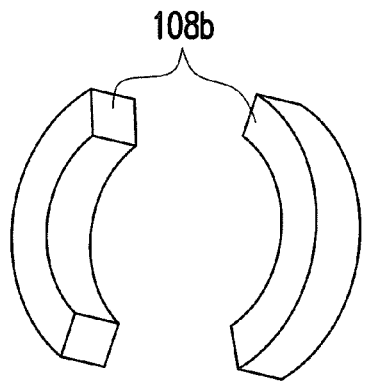
FIG. 4 is a top view of another embodiment of a metal layer of FIG. 2.

FIG. 3 and FIG. 4 are top views of two embodiments of the metal layer 108 of FIG. 2. A metal layer 108a of FIG. 3 is a rectangular block-shape structure, and a metal layer 108b of FIG. 4 is a slightly curved ear-shape structure.

Figure 5:
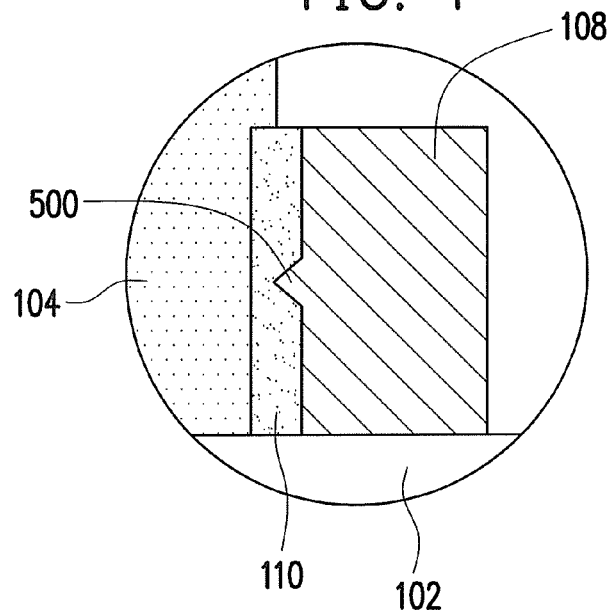
FIG. 5 is a partially amplified diagram of FIG. 1 or FIG. 2.

Moreover, the shape of the metal layer 108 of FIG. 1 or FIG. 2 has different variations, as shown in FIG. 5. FIG. 5 is a partially amplified diagram of FIG. 1 or FIG. 2. The metal layer 108 of FIG. 5 further includes a tip 500 facing to the solid electrolyte layer 104, which is used for enhancing an effect of the electric field.

FIG. 6A to FIG. 6F are schematic diagrams illustrating a process flow of a CBRAM device according to another embodiment of the present invention.

Figure 6A:
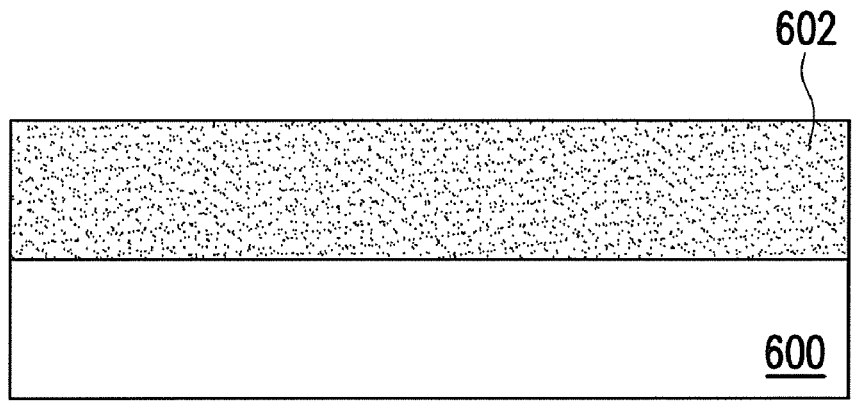
FIG. 6A to FIG. 6F are schematic diagrams illustrating a process flow of a CBRAM device according to another embodiment of the present invention.

Referring to FIG. 6A, a dielectric layer 602 is first formed on a first electrode layer 600. As described above, the material of the first electrode layer 600 is, for example, an inert metal such as Pt, W, TiN or Ni. The material of the dielectric layer 602 is, for example, $SiO_2$, SiN or PMMA.

Figure 6B:
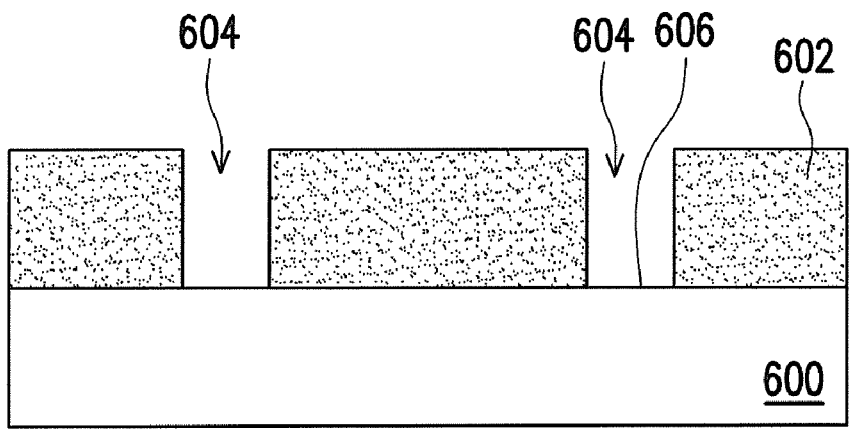

Next, referring to FIG. 6B, a series of processes including exposure, development and etching is performed to form a first groove 604 in the dielectric layer 602, and the groove 604 exposes a surface 606 of the first electrode layer 600. The etching process in the series of processes to form the first groove 604 is, for example, a dry etching or a wet etching. Moreover, in the present embodiment, two first grooves 604 are illustrated, though the present invention is not limited thereto, and a single or more than two grooves can also be formed.

Figure 6C:
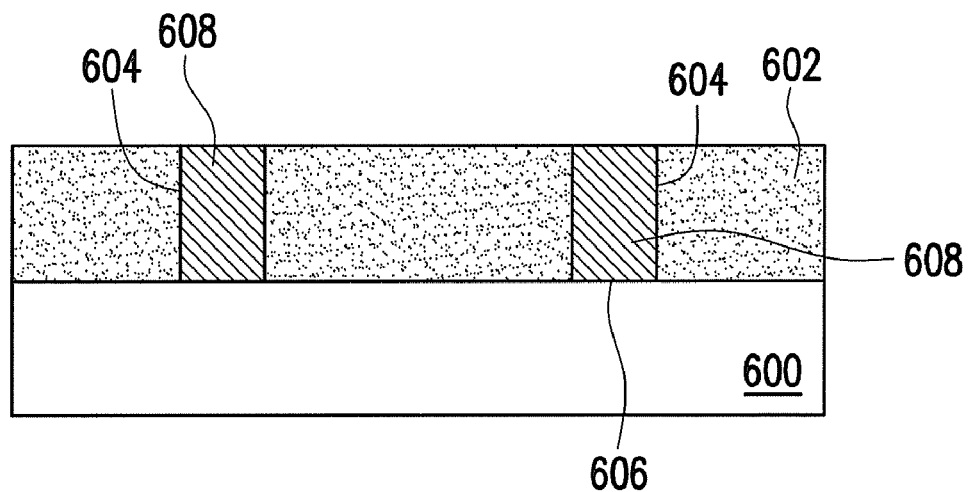

Next, referring to FIG. 6C, a metal layer 608 used for generating the electric field is filled in the first groove 604, and steps of filling the first groove 604 can be described as follows. First, the metal layer 608 is deposited on the dielectric layer 602 and on the surface 606 of the first electrode layer 600. Next, the metal layer 608 on the surface of the dielectric layer 602 is removed by a chemical-mechanical polishing (CMP) method, for example. The material of the metal layer 608 can be a conductive metal composite material or a metal material.

Figure 6D:
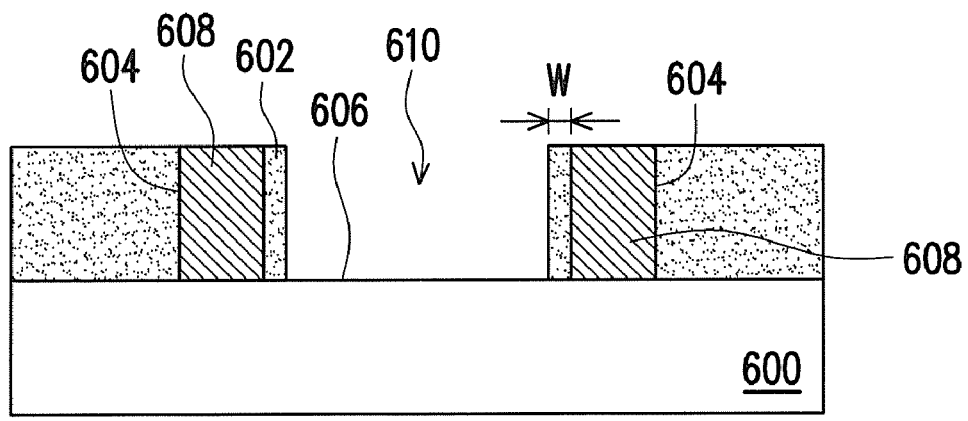

Next, referring to FIG. 6D, another series of processes including exposure, development and etching are performed to form a second groove 610 in the dielectric layer 602 near the first groove 604, and the second groove 610 exposes the surface 606 of the first electrode layer 600. In the present embodiment, a size of the second groove 610 is greater than that of the first groove 604. Moreover, the metal layer 608 of the present embodiment has a double-side structure, so that the groove 610 can be formed in the middle of the double-side structure.

Moreover, a width "w" of the dielectric layer 602 between the second groove 610 and the first groove 604 is the smaller the better, so that the metal layer 608 in the first groove 604 may have a relatively obvious electric field effect. The method of forming the second groove 610 can be a dry etching or a wet etching.

Figure 6E:
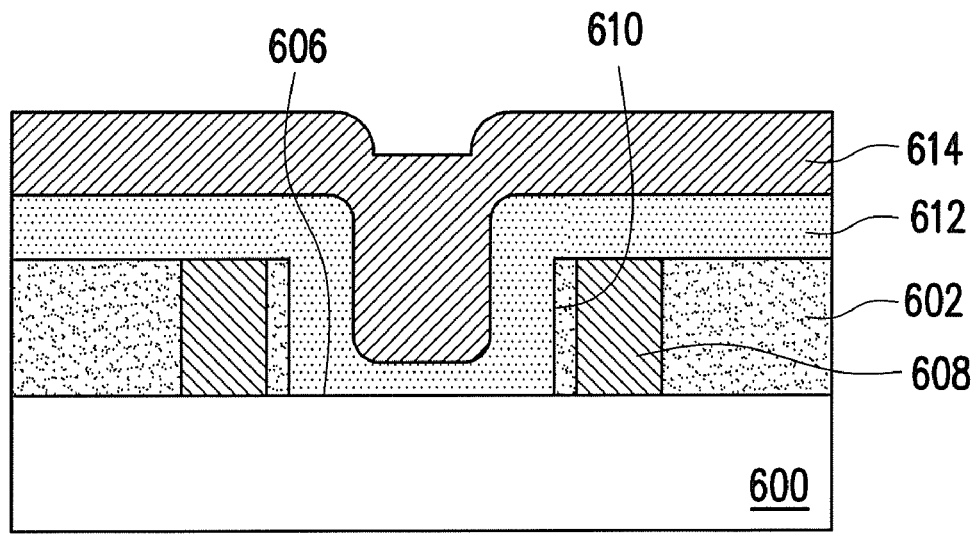

Furthermore, referring to FIG. 6E, a solid electrolyte layer 612 is conformally deposited on the dielectric layer 602, the inner wall of the second groove 610 and the surface 606 of the first electrode layer 600, and a material thereof is, for example, chalcogenide such as Ge—Se or Ge—S, or $Ag_2S$, $Cu_2S$, $Ta_2O_5$, $W_2O_3$ or $SiO_2$, etc. Next, a second electrode layer 614 is deposited on the solid electrolyte layer 612, and a material of the second electrode layer 614 includes Ag or Cu, etc.

Figure 6F:
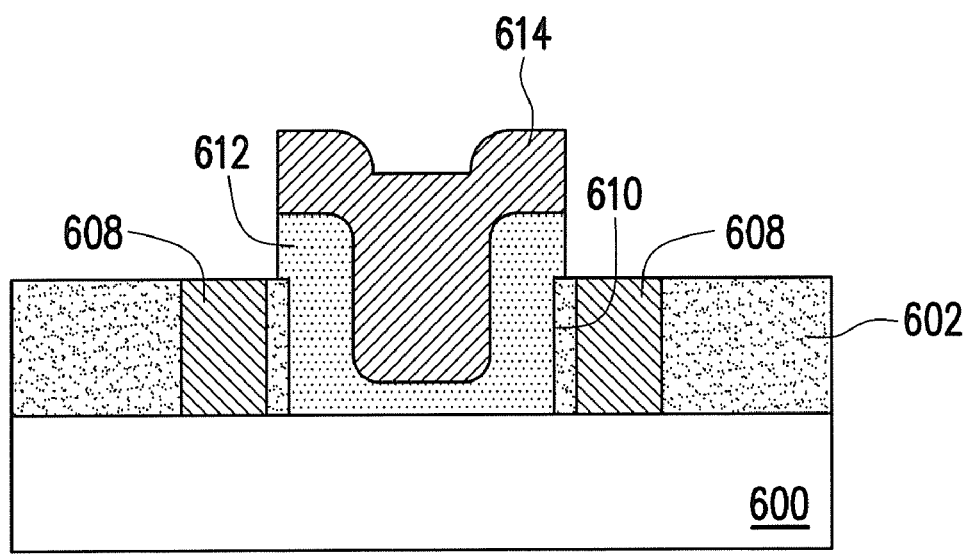

Next, referring to FIG. 6F, the solid electrolyte layer 612 and the second electrode layer 614 outside the second groove 610 can be removed, though as long as the solid electrolyte layer 612 is not contacted to the metal layer 608, a part of the solid electrolyte layer 612 and the second electrode layer 614 can still be remained on the dielectric layer 602 outside the second groove 610. The method of removing the solid electrolyte layer 612 and the second electrode layer 614 is, for example, a dry etching or a wet etching.

In summary, the metal layer that can generate the external electric field is added to the original CBRAM device, so that when the positive voltage is applied to the first electrode layer during the erase operation, the metal layer connected to the first electrode layer can generate a positive electric field, which can repels the metal ions dispersed in the solid electrolyte layer, so as to accelerate a break of the mutually connected metal filaments. Therefore, an efficiency for the device being converted from a low to a high resistance state is increased, and accordingly an endurance of the device can be improved, and a switching time can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A conductive bridging random access memory (CBRAM) device, comprising:
    a first electrode layer;
    a solid electrolyte layer, disposed on the first electrode layer;
    a second electrode layer, disposed on the solid electrolyte layer;
    a metal layer, disposed near the solid electrolyte layer, wherein the metal layer is on at least one side of the solid electrolyte layer; and
    a dielectric layer, disposed between the solid electrolyte layer and the metal layer.

2. The CBRAM device as claimed in claim 1, wherein the dielectric layer has a groove.

3. The CBRAM device as claimed in claim 2, wherein the solid electrolyte layer is located in the groove.

4. The CBRAM device as claimed in claim 2, wherein the solid electrolyte layer covers an inter surface of the groove.

5. The CBRAM device as claimed in claim 1, wherein the metal layer and the first electrode layer are electrically connected.

6. The CBRAM device as claimed in claim 1, wherein the metal layer further comprises at least a tip facing to the solid electrolyte layer.

7. The CBRAM device as claimed in claim 1, wherein the metal layer is a single-side structure.

8. The CBRAM device as claimed in claim 1, wherein the metal layer is a double-side structure.

9. The CBRAM device as claimed in claim 1, wherein a material of the metal layer comprises a conductive metal composite material or a metal material.

10. The CBRAM device as claimed in claim 1, wherein a material of the first electrode layer comprises an inert metal.

11. The CBRAM device as claimed in claim 10, wherein the inert metal comprises Pt, W, TiN or Ni.

12. The CBRAM device as claimed in claim 1, wherein a material of the dielectric layer comprises $SiO_2$, SiN or PMMA.

13. The CBRAM device as claimed in claim 1, wherein a material of the solid electrolyte layer comprises a chalcogenide or $Ag_2S$, $Cu_2S$, $Ta_2O_5$, $W_2O_3$ or $SiO_2$.

14. The CBRAM device as claimed in claim 13, wherein the chalcogenide comprises Ge—Se or Ge—S.

15. The CBRAM device as claimed in claim 1, wherein a material of the second electrode layer comprises Ag or Cu.

* * * * *